(12) United States Patent
Shen et al.

(10) Patent No.: US 10,574,243 B2
(45) Date of Patent: Feb. 25, 2020

(54) APPARATUS AND METHOD FOR GENERATING STABLE REFERENCE CURRENT

(71) Applicant: Intel Corporation, Santa Clara, CA (US)

(72) Inventors: Kuan-Yueh Shen, Portland, OR (US); Yongping Fan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/414,518

(22) Filed: Jan. 24, 2017

(65) Prior Publication Data

US 2018/0212611 A1 Jul. 26, 2018

(51) Int. Cl.
| | |
|---|---|
| H03L 7/095 | (2006.01) |
| H03L 7/099 | (2006.01) |
| H03L 7/089 | (2006.01) |
| H03L 7/093 | (2006.01) |
| H03L 3/00 | (2006.01) |

(52) U.S. Cl.
CPC ............. *H03L 7/095* (2013.01); *H03L 3/00* (2013.01); *H03L 7/0891* (2013.01); *H03L 7/0895* (2013.01); *H03L 7/0898* (2013.01); *H03L 7/093* (2013.01); *H03L 7/099* (2013.01); *H03L 7/0992* (2013.01)

(58) Field of Classification Search
CPC ......... H03L 7/095; H03L 3/00; H03L 7/0891; H03L 7/0893; H03L 7/0895; H03L 7/0896; H03L 7/0898; H03L 7/093; H03L 7/099; H03L 7/0991; H03L 7/0992; H03L 7/0993–0998

USPC ........................................................ 327/157
See application file for complete search history.

(56) References Cited

U.S. PATENT DOCUMENTS

| | | | | | |
|---|---|---|---|---|---|
| 6,720,803 | B2* | 4/2004 | Pihlstrom | .......... | H03K 19/0013 326/23 |
| 6,903,615 | B2* | 6/2005 | Landman | ................. | H03K 3/03 327/156 |
| 7,821,350 | B2* | 10/2010 | Dai | .......... | H03L 7/189 331/179 |
| 8,067,987 | B2* | 11/2011 | Sen | ....... | H03B 5/1852 327/156 |
| 8,355,431 | B2* | 1/2013 | Lee | ........ | H03L 7/0807 327/107 |
| 8,892,060 | B2* | 11/2014 | Wang | .......... | H04L 27/0014 331/16 |
| 9,197,224 | B2* | 11/2015 | Kinget | ..... | H04L 27/18 |
| 9,742,380 | B1* | 8/2017 | Raj | ......... | H03K 3/013 |

(Continued)

OTHER PUBLICATIONS

Sedra et al. (Microelectronic Circuits, 5th edition, Oxford University Press, 2004).*

(Continued)

*Primary Examiner* — Patrick C Chen
(74) *Attorney, Agent, or Firm* — Green, Howard & Mughal LLP

(57) ABSTRACT

An apparatus is provided which comprises: an oscillator to generate a first clock having a first frequency; a divider coupled to the oscillator, wherein the divider is to generate a second clock having a second frequency; and a current reference generator comprising a switched capacitor circuitry which is to receive the second clock directly or indirectly.

19 Claims, 17 Drawing Sheets

(56) References Cited

U.S. PATENT DOCUMENTS 9,859,904 B1 * 1/2018 Summers .............. H03L 7/0802
2004/0160281 A1 * 8/2004 McDonald, II ....... H03L 7/0898
331/16

OTHER PUBLICATIONS

Maneatis et al. "Self-biased high-bandwidth low-jitter 1-to-4096 multiplier clock generator PLL", IEEE Journal of Solid-State Circuits 38. 11 (2003): 1795-1803 See IDS for the documentation. (Year: 2003).*

Maneatis, J. et al., "Low-jitter process-independent DLL and PLL based on selfbiased techniques", IEEE Journal of Solid-State Circuits. 31.11 (1996): 1723-17323.

Maneatis, J. et al., "Self-biased high-bandwidth low-jitter 1-to-4096. multiplier clock generator PLL", IEEE Journal of Solid-State Circuits. 38.11 (2003): 1795-1803.

Shen, K. et al. "A 0.17-to-3.5mW 0.15-to-5GHz SoC PLL with 15dB built-in supply noise rejection and self-bandwidth control in 14nm CMOS", 2016 IEEE International Solid-State Circuits Conference (ISSCC). IEEE, 2016.

Shen, K. et al. "A Flexible, Low-Power Analog PLL for SoC and Processors in 14nm CMOS", IEEE Transactions on Circuits and Systems—I: Regular Papers, vol. 56, No. 7, 2018. pp. 2109-20177 (9 pages).

* cited by examiner

APPARATUS AND METHOD FOR GENERATING STABLE REFERENCE CURRENT

BACKGROUND

A variety of analog and digital circuits use reference currents to perform their function. For example, in a type-II charge-pump based phase locked loop (CP-PLL), a local reference current ($I_{REF}$) and current mirrors are used to provide appropriate UP and DOWN pumping currents (collectively referred to as $I_{CP}$), which are pumped into a loop filter. Generally, the charge pump current $I_{CP}$ is proportional to the reference current $I_{REF}$. However, generating a precise reference current $I_{REF}$ is challenging. Without a precise reference current $I_{REF}$, stability and bandwidth of a PLL (which are important parameters for gauging performance of a PLL) can vary considerably as a result of process and temperature variation for a fixed output frequency. For a PLL supporting a wide output frequency range, linear and precise scaling of $I_{REF}$ with frequency is another challenge.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
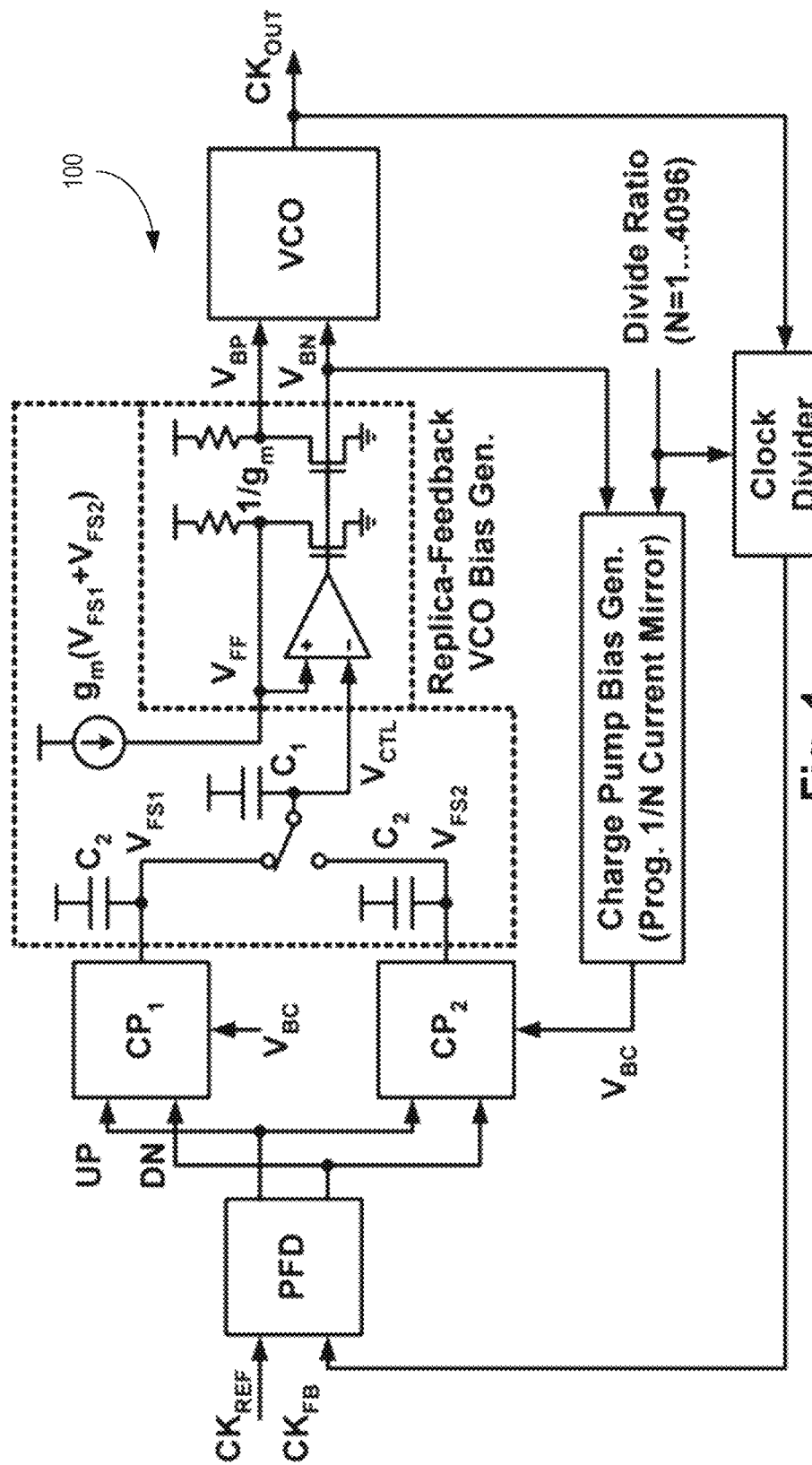
FIG. 1 illustrates a high-level architecture of a charge pump based phase locked loop (CP-PLL) that uses an oscillator bias generated reference current with manual programmability for different feedback clock divide ratios.

With recent advancements in System-on-Chip (SoC) integration, modern SoC architectures can employ many PLLs (e.g., more than 20 PLLs). To address SoC clocking needs with an ever reducing power budget, in one example, a deep sub-milliwatt (mW) to low-mW PLL having a Figure-of-Merit (FoM) between −226 dB and −234 dB from 0.8 GHz to 5 GHz is described using self-bandwidth and stability control apparatus of various embodiments. In some embodiments, part of this apparatus is realized by a reference current generator that uses the output of an oscillator to control the switch capacitor (or resistance) network of the reference current generator. The PLL of various embodiments features a modular implementation and therefore can be used as the local clock source or as part of a clock-generation hub. The clock-generation hub provides reference clocks to subsystems from a single platform crystal oscillator through a combination of divisions and distributions, in accordance with some embodiments.

Minimizing the supply sensitivity of ring oscillator-based digital control oscillators (DCOs) or voltage control oscillators (VCOs), and thus the PLL deterministic jitter (Dj), often leads to adopting a low-dropout (LDO) voltage regulator. The LDO voltage regulator provides power supply to the oscillator and other circuits of the PLL, for example. Effective Dj reduction typically requires greater than, for example 30 dB power-supply rejection ratio, across a frequency range multiple times the PLL bandwidth. However, an LDO supporting such a frequency range without increasing the LDO power/area can result in significant device noise from the LDO that degrades PLL's random jitter (Rj) (e.g., by 2-3 times). Prior Dj solutions eliminate LDOs, or trade Dj for Rj, power, design complexity and/or the need for a specific ring oscillator topology. Here, various embodiments describe a PLL which offers high built-in supply noise rejection (e.g., approximately 15 dB) with little or no extra circuits and no Rj loss.

In all-digital PLLs (ADPLLs) that use DCOs, low jitter is achieved with higher power consumption and with a high-resolution time-to-digital converter (TDC) to suppress quantization noise. Besides, while a wider PLL bandwidth suppresses more DCO noise, ADPLLs suffer from a larger loop delay that limits the bandwidth unless a higher reference frequency ($f_{REF}$) is used, which leads to further power increase.

The type-II PLL of various embodiments supports wide bandwidth while limiting transfer peaking. For example, for a 19.2 MHz $f_{REF}$, the PLL of various embodiments is able to extend its −3 dB bandwidth to 40% or 47% of $f_{REF}$, while the transfer function peaking is less than 1.9 dB or less than 3.4 dB, respectively. While some existing PLLs may extend the bandwidth to 50% of a 22.6 MHz $f_{REF}$, but such PLLs may not be suitable for SoC clocking due to its type-I static phase error and lock acquisition range, both of which are type-II PLL's advantages that come from the PLL of some embodiments. In some embodiments, the PLL offers self-control of the loop bandwidth for the output frequency range where the VCO gain ($K_{VCO}$ in GHz/V) does not roll off. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

A type-II charge pump phase locked loop (CP-PLL) usually uses a local reference current ($I_{REF}$) and mirrors it to produce appropriate UP and DOWN (DN) pumping current $I_{cp}$ into the PLL loop filter. $I_{CP}$ is proportional to $I_{REF}$. Precision of $I_{REF}$ impacts PLL dynamics. For a second-order CP-PLL, its stability and bandwidth can be gauged with the damping factor $\zeta$ and the natural frequency $\omega_n$, respectively as:

$$\zeta = \frac{R_P}{2}\sqrt{\frac{I_{CP}C_P K_{VCO}}{2\pi N}} \text{ and } \omega_n = \sqrt{\frac{I_{CP}K_{VCO}}{2\pi N C_P}}$$

where $K_{VCO}$ means the gain of a voltage controlled oscillator (VCO) of CP-PLL, N is the feedback divide ratio of the feedback divider of the CP-PLL, and $R_P$ and $C_P$ are the resistance and capacitance, respectively, in a passive R-C loop filter of the CP-PLL.

If $I_{CP}$ linearly scales with respect to N, then the CP-PLL can keep constant $\zeta$ and $\omega_n$ based on the expressions. The $I_{CP}/N$ relationship in the loop parameters also holds for the sample-reset (SR) loop filter and effective $R_P$ can be written as:

$$R_{P,SR} = \frac{2\pi I_{CP2}}{\omega_{REF} I_{CP1}(C_1 + C_2)}.$$

where $I_{CP1}$ and $I_{CP2}$ are the pumping currents of the integral and proportional charge pumps, respectively, to the SR loop filter. $C_1$ is integral capacitance of the loop filter and $C_2$ is a voltage reset capacitance. When $I_{CP2}$ and $I_{CP}$ are derived from the same $I_{REF}$, their ratio is fixed, and so does $R_{P,SR}$. Here, $\omega_{REF}$ is the PLL reference frequency.

In the legacy Self-Biased PLL (SBPLL) (not shown), $\zeta$ does not stay constant with different Ns for a given $\omega_{REF}$. If N changes significantly, SBPLL should be re-configured to keep $\zeta$ and $\omega_n$.

FIG. 1 illustrates a high-level architecture 100 of a CP-PLL that uses an oscillator bias generated reference current with manual programmability for different feedback clock divide ratios. In this revised SBPLL with a new loop filter design shown in FIG. 1, $\zeta$ and $\omega_n$ can be adjusted by re-programming an inverse-linear current mirror whenever N is changed and then keep the two loop parameters invariant. Components for SBPLL of FIG. 1 and their connections are not described since they are well known in the art. Though SBPLL of FIG. 1 may be capable of self-controlling $\zeta$ and $\omega_n$ (with its programmable current mirror) for N, SBPLL in general face significant problems to achieve low power particularly with low jitter. Thus one challenge has been realizing an apparatus that enables self ζ and $\omega_n$ maintenance in a low power PLL.

Figure 2:
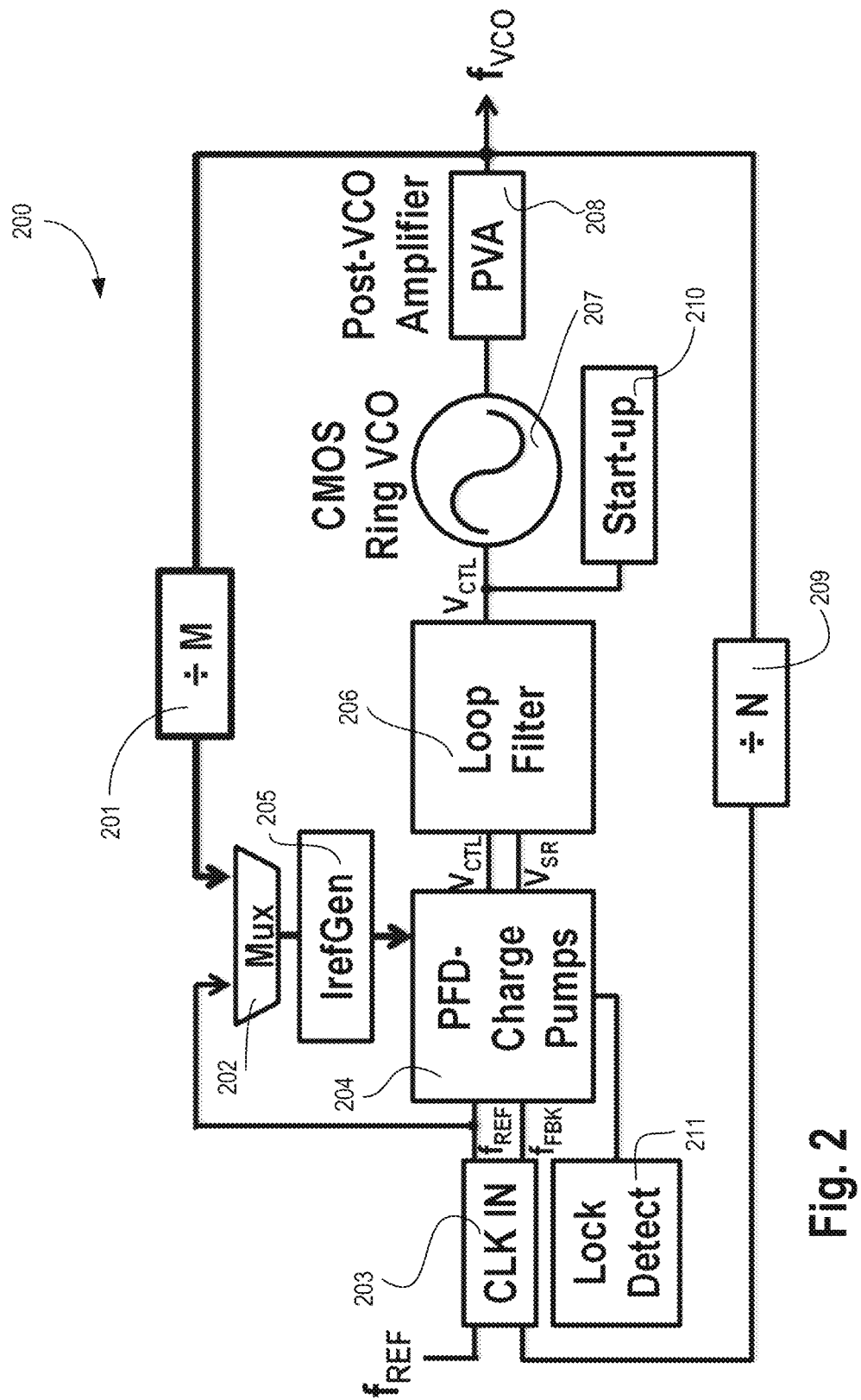
FIG. 2 illustrates a high-level architecture of a CP-PLL that selectively uses one of a reference clock or an oscillator output clock to generate a reference current ($I_{REF}$), according to some embodiments of the disclosure.

FIG. 2 illustrates a high-level architecture 200 of a CP-PLL that selectively uses one of a reference clock or oscillator output clock to generate $I_{REF}$, according to some embodiments of the disclosure.

In some embodiments, CP-PLL of architecture 200 comprises feedback divider 201 (also referred to as the second divider), multiplexer (Mux) 202, input clock buffer (CLK IN) or input clock distribution 203, phase-frequency detector (PFD), one or more charge pumps (CPs) with integral and proportional paths (here, PFD and CP are collectively indicated by reference 204), reference current generator (IrefGen) 205 that delivers $I_{REF}$ to both CPs (in an architecture where dual CPs are used), switched-capacitor based loop filter 206, voltage controlled oscillator (VCO) 207, post-VCO amplifier (PVA) 208, feedback divider 209 (also referred to as the first divider), start-up circuitry 210, and lock detector 211.

In some embodiments, a reference clock having a reference frequency $f_{REF}$ is received by clock buffer 203 which provides the buffered reference clock to the PFD in block 204. The feedback clock having frequency $f_{FBK}$ is also conditioned by the clock buffer 203, and then the buffered feedback clock is provided to the PFD in block 204. A person skilled in the art would appreciate that clock buffer 203 has two clock paths, one for the reference clock and the other for the feedback clock such that both clock paths have the same propagation delay. In some embodiments, the two paths are electrically swappable in clock buffer 203 for PLL phase error measurement. For example, the circuit path for the feedback clock can be used for the reference clock while the circuit path for the reference clock can be used for the feedback clock.

The PFD in block 204 compares the edges of the reference clock and the feedback clock to determine whether the feedback clock edge is ahead or behind a reference clock edge. Any suitable PFD may be used as the PFD in block 204. The PFD in block 204 generates UP or DOWN (DN) pulses. These pulses are received by the charge pump(s) in block 204. The charge pump charges or discharges the node $V_{CTL}$ according to the UP and DN pulses from the PFD. During that process, the charge pump uses $I_{REF}$ and mirrors it to produce the pump currents that fire when UP and DN are high. The proportional, or the second, charge pump charges $V_{SR}$, which is the voltage sample and reset node of the loop filter and also the output node of the second charge pump.

Here, labels for nodes and signals on those nodes are interchangeably used. For example, $V_{CTL}$ may refer to voltage $V_{CTL}$ or node $V_{CTL}$ depending on the context of the sentence.

The loop filter 206 has two input ports $V_{CTL}$ and $V_{SR}$, taking charges from the integral (first) and proportional (second) charge pumps, respectively. In each reference clock cycle, proportional charges coming to $V_{SR}$ (and to $V_{CTL}$) during UP/DN is reset to $V_{RST}$ by end of the cycle in loop filter 206. $V_{CTL}$ is received by VCO 207 to set or adjust the oscillating frequency of VCO 207. In some embodiments, oscillator 207 is a DCO. In some such embodiments, the $V_{CTL}$ can be converted to a corresponding digital code to digitally control the propagation delay of the DCO delay stages. In some embodiments, integral capacitor $C_1$ of Loop Filter 206 is instantiated between $VCC_{PLL}$, the PLL supply, and $V_{CTL}$. In some embodiments, the proportional path is based on the sample and reset topology, but the reset circuit is modified to reset to $VCC_{PLL}/2$ for lower power and balanced proportional charge pump current matching between UP and DN.

The output of VCO 207 is then amplified by PVA 208 to provide an output clock with frequency $f_{VCO}$. In some embodiments, VCO 207 employs current tuning in its p-type current source and capacitive loading tuning in the delay stages to control the frequency range, $K_{VCO}$ and VCO phase noise.

The output clock is then divided down in frequency by first divider 209 (e.g., divide by 'N') to generate the feedback clock. In some embodiments, the output clock is divided down by second divider 201 (e.g., divide by 'M') and the divided down clock is used to generate the $I_{REF}$. In some embodiments, 'N' is different than 'M'. In some embodiments, 'N' is same as 'M'. In various examples, 'M' is 16. In some embodiments, first and/or second dividers 209 and 201, respectively, are integer dividers. In some embodiments, first and/or second dividers 209 and 201, respectively, are fractional dividers. The dividers 201 and 209 can be implemented using any suitable divider circuitry. For example, Johnson Counters can be used for implementing dividers 201 and 209.

In some embodiments, multiplexer (Mux) 202 is used to selectively provide one of output of divider 201 or the reference clock for generating $I_{REF}$ by reference generator 205 (IrefGen).

In some embodiments, during PLL start up (e.g., when PLL is powered up), a start-up circuitry 210 is used to set $V_{CTL}$ at a certain level so that the PLL achieves a fast lock. For example, $V_{CTL}$ is set at $\frac{1}{3}^{rd}$ of the power supply level ($VCC_{PLL}$) during the start-up process. In some embodiments, Start-up circuit 210 charges $V_{CTL}$ toward a preset voltage for a programmable number of reference cycles once the PLL is enabled.

In some embodiments, lock detector 211 (Lock Detect) monitors the UP and DN pulses to determine when the PLL has substantially achieved phase lock. Upon phase lock for a certain predetermined time, lock detector 211 indicates a lock (e.g., by asserting or de-asserting a lock signal). In some embodiments, the lock signal is used by the second divider 201 to adaptively change its divide ratio to change the frequency of its output signal (used by IrefGen 205). For example, during power-up or start-up of the PLL, to achieve faster lock, 'M' may be set to a higher value before PLL lock and then set to a lower value after PLL acquires lock.

Since $f_{OUT}$ of a locked PLL is invariant to process-voltage-temperature (PVT), in various embodiments, the IrefGen circuit 205 is to generate $I_{REF}$ where $f_{OUT}$ (or $f_{VCO}$) is fed back to the circuit input, where $f_{OUT}$ is the output of VCO 207.

In various embodiments, the reference current $I_{REF}$ is derived from the VCO output clock, and the current level is linearly proportional to $f_{VCO}$. As such, the damping factor and natural frequency remain constant (e.g., to the first order) over a wide frequency range. The apparatus of FIG. 2 is also insensitive to systematic capacitance variation in the PLL. In the approach in which a reference current from the loop filter, rather than VCO, is used, the current level changes when capacitance of capacitor $C_1$ is digitally re-programmed for a different reference frequency divide ratio Q. Such an approach is not only sensitive to capacitance variation, but requires the additional capacitance $C_1$ programmability whose resolution is limited especially when Q is large. In various embodiments, the $I_{REF}$ automatically adjusts itself across 'N' and so there may be no need to re-program anything along the loop of CP-Loop Filter-VCO-IrefGen-CP path.

In some embodiments, the main PLL loop (e.g., 203→204→206→207→208→209) dominates the PLL feedback dynamics, driving the PLL to settle like a typical type-II PLL. In some embodiments, PLL start-up circuit 210 brings the VCO control voltage $V_{CTL}$ to $VCC_{PLL}/2$ in a few reference cycles, delivering an initial $f_{VCO}$ high enough to kick off $I_{REF}$ generation. Note that as the damping factor and natural frequency are made independent of VCO frequency in various embodiments, the PLL lock acquisition process is as efficient as typical type-II PLLs.

Figure 3:
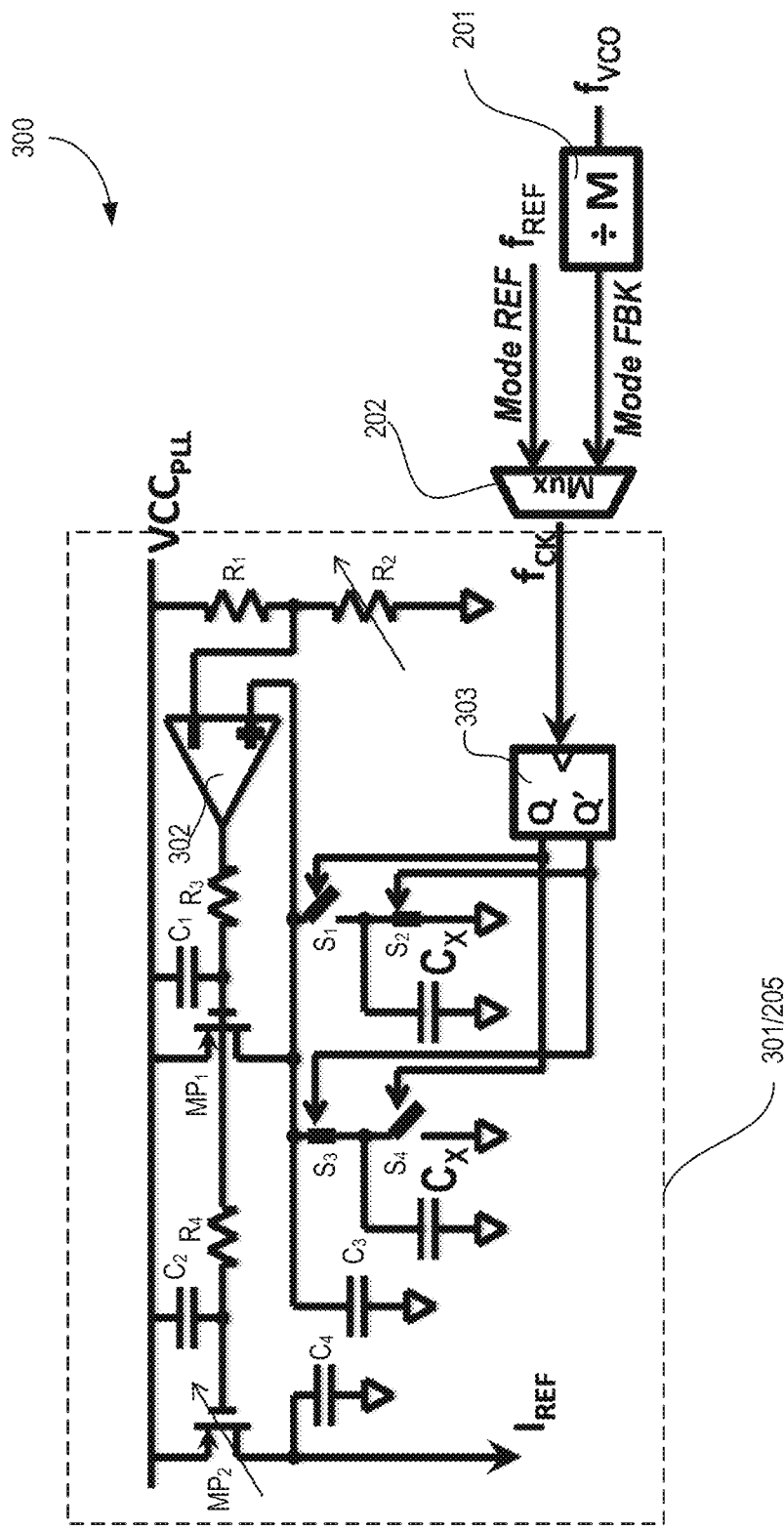
FIG. 3 illustrates a reference current generator, according to some embodiments of the disclosure.

FIG. 3 illustrates apparatus 300 with the reference current generator 205/301, according to some embodiments of the disclosure. It is pointed out that those elements of FIG. 3 having the same reference numbers (or names) as the elements of any other figure can operate or function in any manner similar to that described, but are not limited to such.

In some embodiments, reference current generator 205/301 includes amplifier 302, sampling logic (e.g., flip-flop) 303, resistive devices (or resistors) $R_1$, $R_2$, $R_3$, and $R_4$; capacitive devices (or capacitors) $C_x$, $C_1$, $C_2$, $C_3$, and $C_4$; p-type transistor $MP_1$ and $MP_2$, and switches $S_1$, $S_2$, $S_3$, and $S_4$. In some embodiments, transistor $MP_2$ has variable drive strength, which can be set by software (e.g., operating system, firmware) or hardware (e.g., fuses).

In some embodiments, current-voltage feedback is used to replicate the current through a pair of switched-capacitor resistors that can be clocked at $f_{OUT}/M$ as Mode FBK to produce $I_{REF}$. Here, Mode FBK refers to the case or mode of operation when Mux 202 selects $f_{VCO}$ as $f_{CK}$, while Mode REF refers to the case or mode of operation when Mux 202 selects $f_{REF}$ as $f_{CK}$. Here, $f_{CK}$ is the sampling clock for sampling logic 303, which generated sampled output to control the switches $S_{1-4}$. In some embodiments, the data to sampling logic 303 is tied to high (e.g., $VCC_{PLL}$). The outputs sampling logic 303 are complementary outputs. For example, output Q' is an inverted version of output Q. Output Q is used to control switches $S_1$ and $S_4$ while the complementary output Q' is used to control switches $S_2$ and $S_3$. The switches can be implemented as pass-gates or transmission gates. For example, the outputs Q and Q' are coupled to gate terminals of transistors that function as the switches.

In some embodiments, 'M' of second divider 201 is configurable, and independent of 'N' of first divider 209. In some embodiments, the PLL's main feedback loop (e.g., 204→206→207→208→209→203) converges the produced $I_{REF}$. Settled $I_{REF}$ is linearly proportional to the capacitor switching frequency ($f_{OUT}/M$) and the value of switched capacitors (Cx):

$$I_{REF}=V_{REF}\cdot 2C_x\cdot f_{OUT}/M$$

where $V_{REF}$ is the positive input voltage of amplifier 302.

In some embodiments, amplifier 302 is any suitable amplifier (e.g., operational amplifier, single or multiple stage amplifier, folded cascode amplifier, etc.) having a first input (e.g., negative input terminal) coupled to a reference (e.g., a voltage from a resistor divider network formed of resistive devices $R_1$ and $R_2$) and a second input (e.g., positive input terminal) coupled to switches $S_1$ and $S_3$ as shown. Amplifier 302 is configured to control the current through transistor $MP_1$ such that the voltage on capacitor $C_3$ is substantially the same as the reference voltage from the resistor divider network of resistive devices $R_1$ and $R_2$.

The current through the switching resistor-capacitor network is mirrored to $MP_2$, which provides the reference current $I_{REF}$. In some embodiments, resistor $R_3$ and capacitor $C_1$ provide compensation to the amplifier feedback loop. In some embodiments, resistor-capacitor pairs $R_3$-$C_1$ and $R_4$-$C_2$ are used to reduce the ripples in $I_{REF}$ at steady state. In some embodiments, resistor $R_4$ and capacitor $C_2$ are replicas of resistor $R_3$ and capacitor $C_1$. For example, resistor $R_4$ and capacitor $C_2$ have the same ratio of resistance to capacitance as the ratio of resistance to capacitance of resistor $R_3$ and capacitor $C_1$. In some embodiments, the resistance of resistor $R_4$ is the same as the resistance of resistor $R_3$, and the capacitance of capacitor $C_1$ is the same as the capacitance of capacitor $C_2$. The capacitors and resistors in various embodiments can be implemented in any suitable manner. For example, the resistors and capacitors may be implemented as passive or active resistors. In one example, the capacitors are implemented as metal capacitor, transistors capacitors, or a combination of both. In one example, the resistors are implemented as a transistor operating in a linear region.

In some embodiments, the input clock to $I_{REF}$ generation circuit 205/301 can come from an intermediate clock inside first feedback divider 209. In one such embodiment, the function of the second divider 201 can be accomplished by the first divider 209 and so the second divider 201 can be removed.

While the various embodiments describe the reference generator 205/301 to be used for a CP-PLL, the embodiments are not limited to such. Reference generator 205/301 (or its overall architecture 300) of some embodiments can be used for any circuit that needs a stable current reference. For example, reference generator 205/301 (or its overall architecture 300) can be used to provide a reference current for an analog-to-digital converter (not shown). It can also provide a current reference for an inductor-capacitor (LC) PLL, and other circuits that desire to have a stable current reference.

Figure 4:
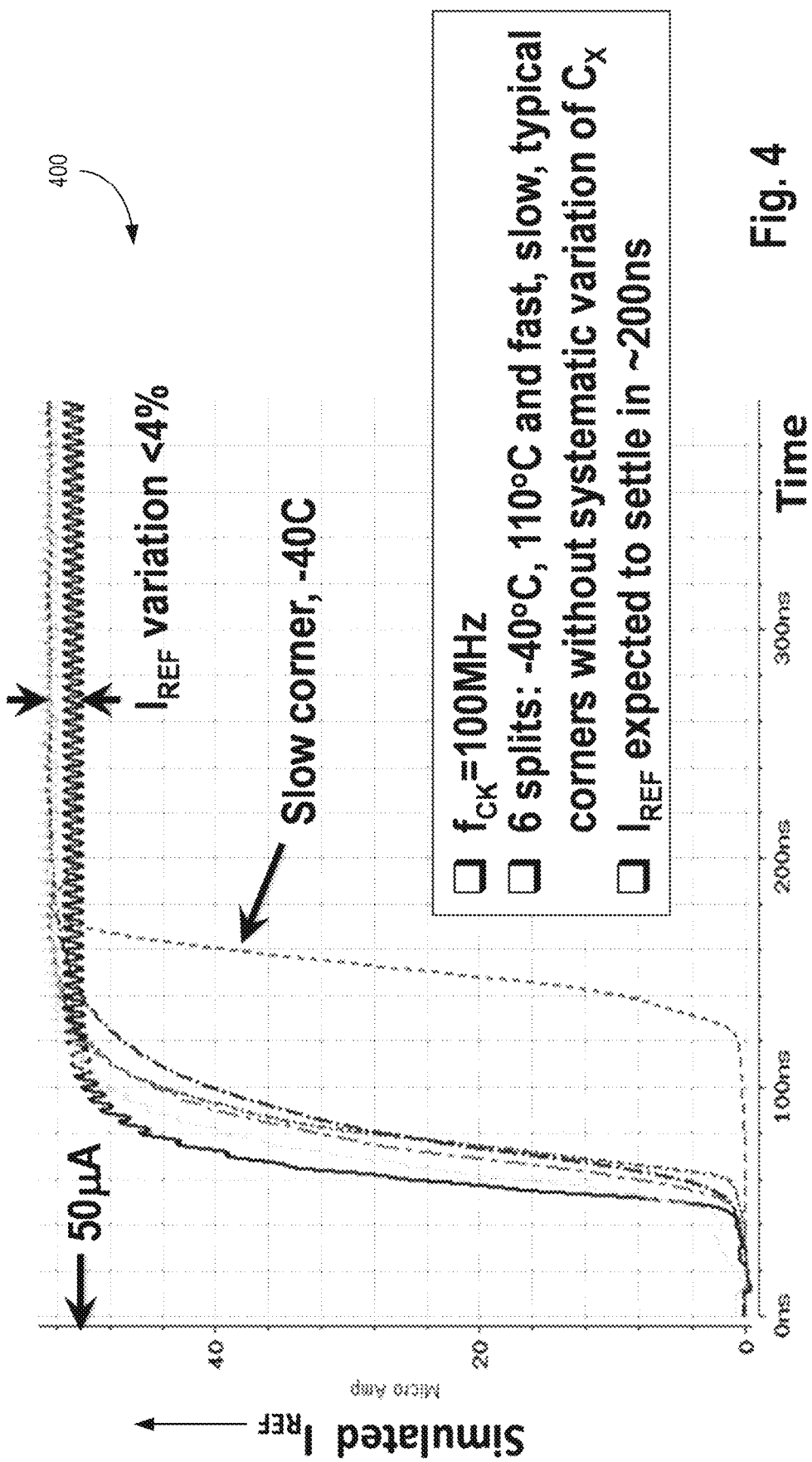
FIG. 4 illustrates a plot showing variation of $I_{REF}$ generated by the reference current generator of FIG. 3, according to some embodiments of the disclosure.

FIG. 4 illustrates plot 400 showing variation of $I_{REF}$ generated by the reference current generator of FIG. 3, according to some embodiments of the disclosure. Here, x-axis is time in nanoseconds (ns) and y-axis is simulated $I_{REF}$ in micro-Amperes (µA). In this example, the transistor and temperature dependency translates to less than 4% $I_{REF}$ variation. The settling of $I_{REF}$ per simulation is less than approximately 200 ns. The PLL lock time with this adds approximately 0.1 micro seconds (µs) for a 100 MHz reference clock (e.g., approximately 1 µs lock time becomes approximately 1.1 µs.).

To protect the $I_{REF}/C_P$ ratio from systematic capacitor variation, $C_x$, $C_1$, and $C_2$ are made of identical capacitor templates in the PLL design, according to some embodiments. In some embodiments, Mode FBK enables the charge pump current to adaptively track four, therefore preserving ζ and $ω_n$ of the PLL across different values of N.

Figure 5:
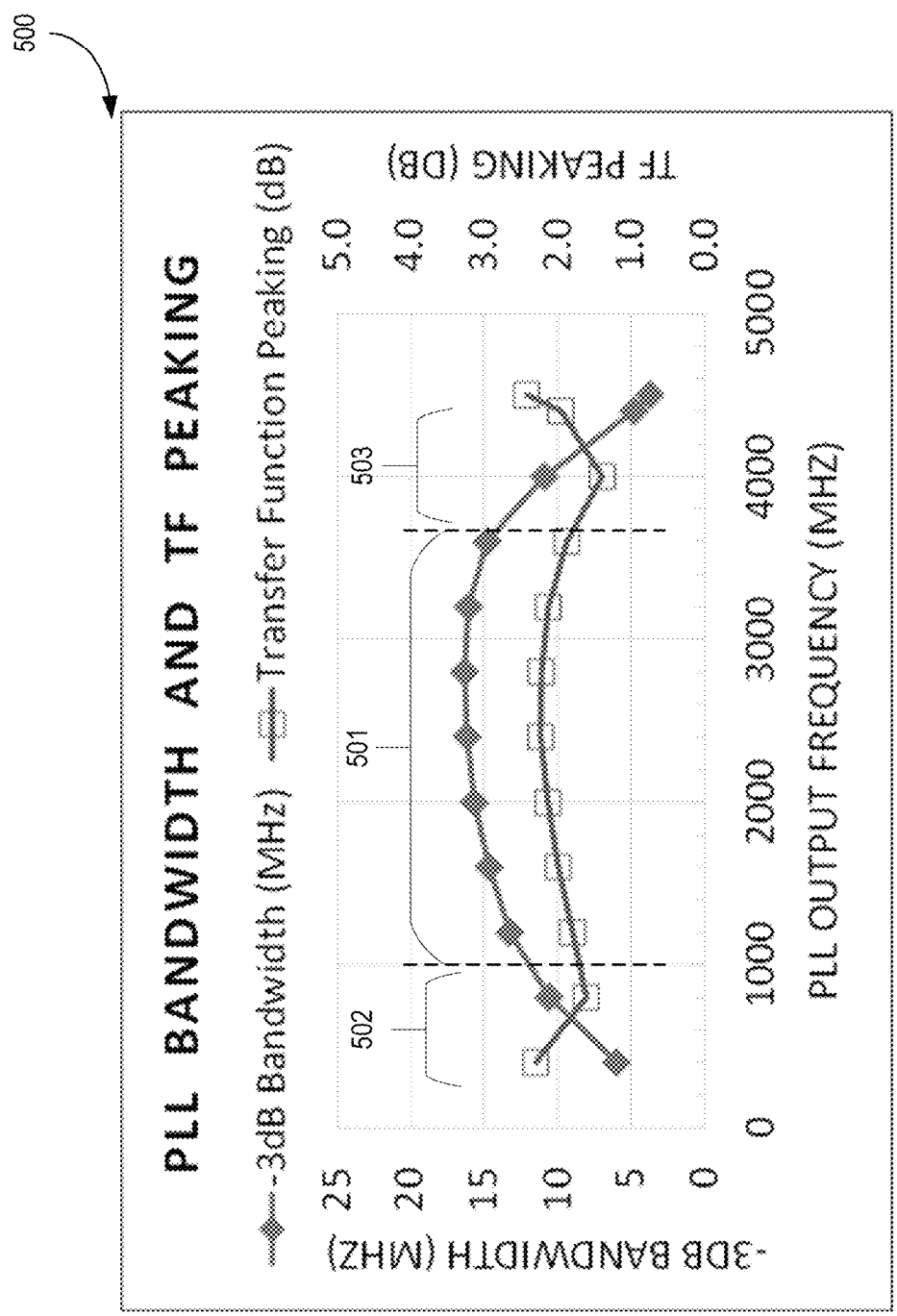
FIG. 5 illustrates a plot showing PLL bandwidth and transfer function peaking over a wide PLL output frequency range using the reference generator of FIG. 3 with $f_{VCO}$ as the input, according to some embodiments of the disclosure.

FIG. 5 illustrates plot 500 showing PLL bandwidth and transfer function peaking over a wide frequency range using the reference generator of FIG. 3, according to some embodiments of the disclosure. Here, the x-axis is PLL output frequency in MHz, the y-axis to the left is −3 dB bandwidth in MHz, while the y-axis to the right is transfer peaking in dB. There are three regions along the two waveforms—501, 502, and 503. Region 501 is a relative flat region which corresponds to a linear portion of $K_{VCO}$. Regions 502 and 503 indicate non-linear portions of $K_{VCO}$. In this example, the loop dynamics maintenance is reflected in a large portion of the measured PLL transfer function (TF)

peaking and PLL −3 dB bandwidth across approximate 11×$f_{VCO}$ range. The 11× frequency range is achieved by varying the number 'N' of first divider 209 (e.g., varying it from 4 to 45). In the measurement, the only PLL configuration change is N (e.g., from 4 to 45). The PLL −3 dB bandwidth starts to decrease with up-ticking PLL transfer function peaking when $K_{VCO}$ roll-off occurs at both ends (low and high $f_{OUT}$). In some embodiments, $f_{OUT}$ can be divided lower by second divider 201 to support adequate input frequency of IrefGen circuit 205.

Figure 6:
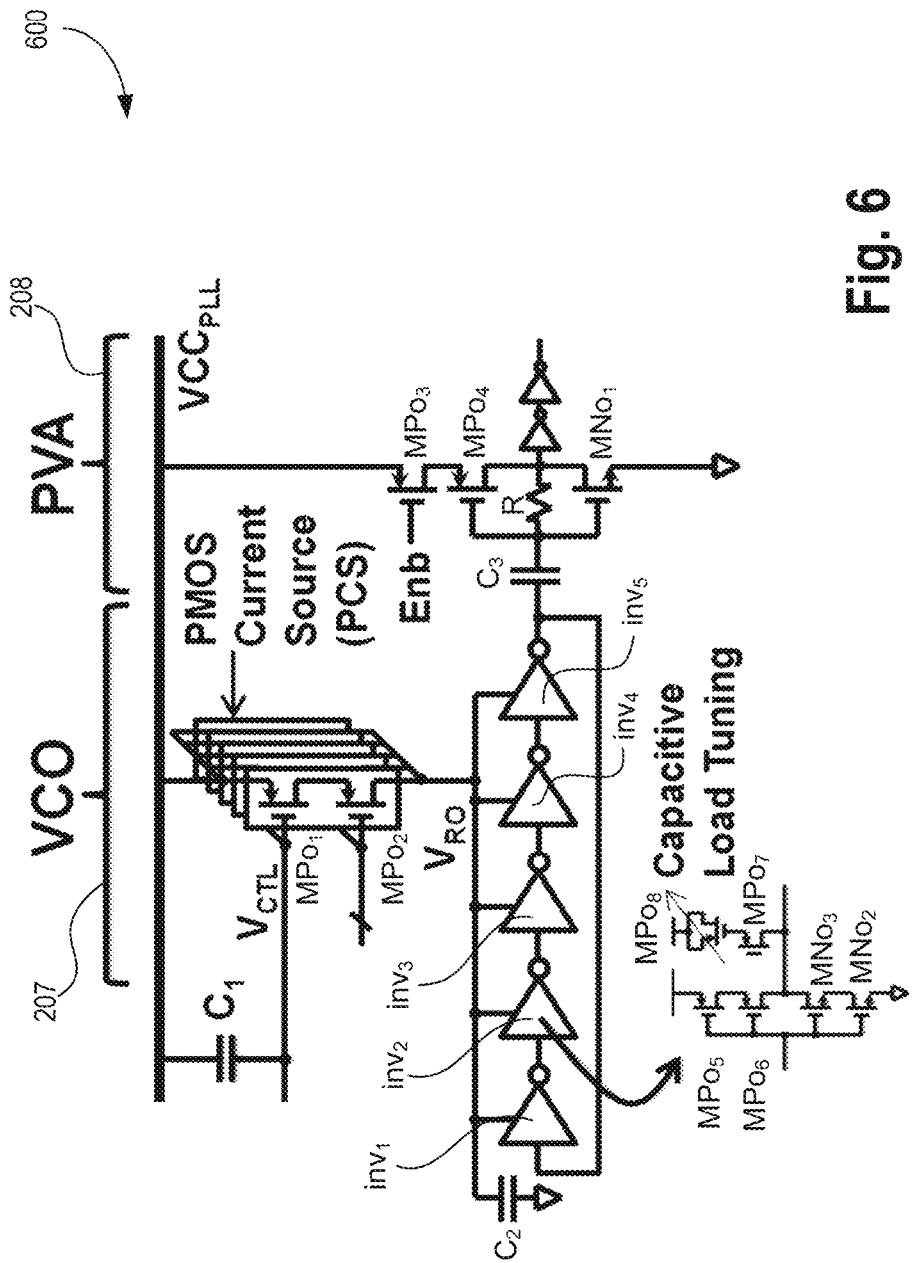
FIG. 6 illustrates an apparatus having an oscillator circuitry, according to some embodiments of the disclosure.

FIG. 6 illustrates apparatus 600 with oscillator circuitry 207 and PVA 208, according to some embodiments of the disclosure. Oscillator circuitry 207 comprises a chain of inverting stages—$inv_{1-5}$ coupled together in a ring and p-type current source (PCS). In some embodiments, p-type current source (PCS) comprises a stack of p-type transistors $MP_{O1}$ and $MP_{O2}$, where $MP_{O2}$ can be digitally controlled while $MP_{O1}$ is controlled by $V_{CTL}$. The stack of p-type transistors provides supply $V_{RO}$ (power supply to oscillator) using $VCC_{PLL}$ as an input supply. Here, capacitor $C_1$ is the capacitor of Loop Filter 206 while capacitor $C_2$ is a decoupling capacitor to stabilize supply $V_{RO}$. In some embodiments, each inverting delay stages (e.g., $inv_{1-5}$) comprises p-type transistors $MP_{O5}$, $MP_{O6}$, $MP_{O7}$, $MP_{O8}$ (e.g., capacitive load tuning circuit), $MN_{O2}$, and $MN_{O3}$ coupled together as shown. While the embodiments illustrates a 5 stage oscillator, any stage oscillator may be used to generate an oscillating frequency.

The output of the VCO 207 is received by PVA 208. In some embodiments, PVA 208 comprises p-type transistors $MP_{O3}$ and $MP_{O4}$, n-type transistor $MN_{O1}$, buffers (here shown as two back-to-back output inverters). In some embodiments, a capacitive device $C_3$ couples an output of VCO 206 with the input of PVA 208.

Figure 7:
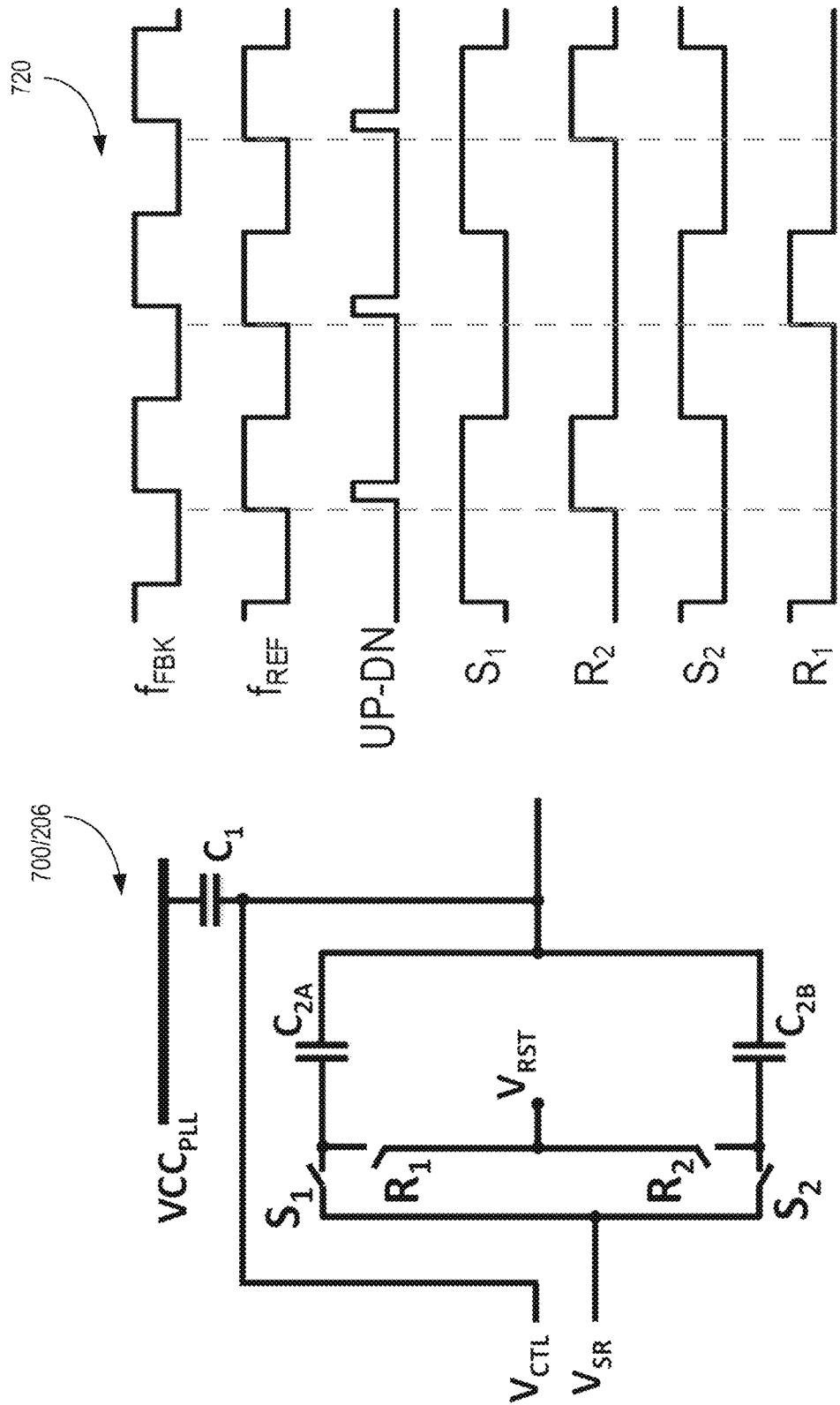
FIGS. 7A-B illustrate a sample-reset loop filter and a corresponding timing diagram, respectively, according to some embodiments of the disclosure.

FIGS. 7A-B illustrate a sample-reset loop filter 700 and a corresponding timing diagram 720, respectively, according to some embodiments of the disclosure. It is pointed out that those elements of FIGS. 7A-B having the same reference numbers (or names) as the elements of any other figure can operate or function in any manner similar to that described, but are not limited to such. In some embodiments, sample-reset loop filter 700 comprises switches controlled by set signals $S_2$ and $S_2$, switches controlled by reset signals $R_1$ and $R_2$, capacitive device $C_{2A}$ and $C_{2B}$, and main loop capacitor $C_1$ coupled together as shown. $V_{CTL}$ is coupled to $C_1$ while $V_{SR}$ is coupled to the sample-reset circuitry, the output of which drives VCO. (Note, here $C_1$ is part of loop filter 206). $V_{RST}$ is a reset voltage which is VCC/2, in accordance with some embodiments. Here, S and R signals are derived from the reference clock. In some embodiments, S and R signals are periodic at half of the reference clock rate. In some embodiments, $S_1$ and $S_2$ are for sampling, making $C_{2A}$ and alternatively $C_{2B}$ ready to take proportional charges.

Figure 8:
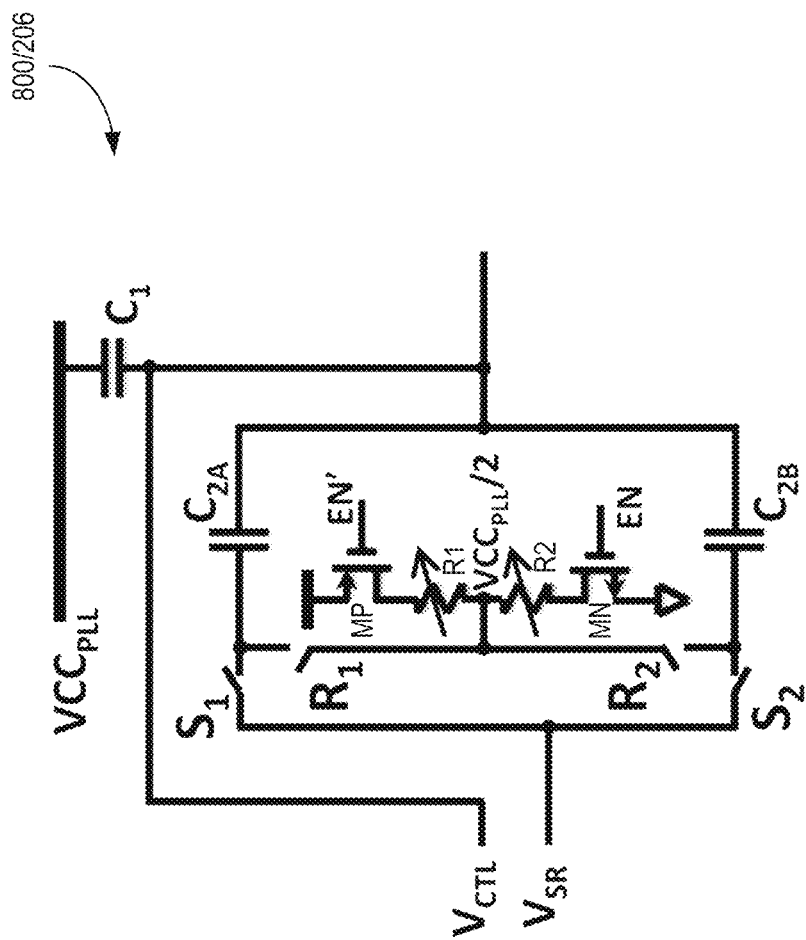
FIG. 8 illustrates a sample-reset loop filter, according to some embodiments of the disclosure.

FIG. 8 illustrates a sample-reset loop filter 800, according to some embodiments of the disclosure. It is pointed out that those elements of FIG. 8 having the same reference numbers (or names) as the elements of any other figure can operate or function in any manner similar to that described, but are not limited to such. Compared to sample-reset loop filter 700, here additional transistors MP and MN, and controllable resistors $R_1$ and $R_2$ are added and coupled together as shown. Transistor MP is controlled by EN' while transistor MN is controlled by EN, where EN' is an inverse of EN. EN and EN' are control signals that can turn the resistor divider off for a period of time before UP/DN signals. Promptly before and during the reset process, where $R_1$ and $R_2$ are high in FIG. 7B, EN is high.

In some embodiments, the node of $VCC_{PLL}/2$ has a decoupling capacitor (not shown) to ground or $VCC_{PLL}$ to deal with timing between the ON time of transistors MN and MP. For example, when EN is high but EN' is not yet low due to some timing mismatch (or any other reason), then the VCC/2 node may get immediately pulled low if there is no de-coupling capacitance connected to this VCC/2 node. As such, having a de-coupling capacitor (even a small one) can assist with mitigating this timing issue between EN and EN'.

Figure 9:
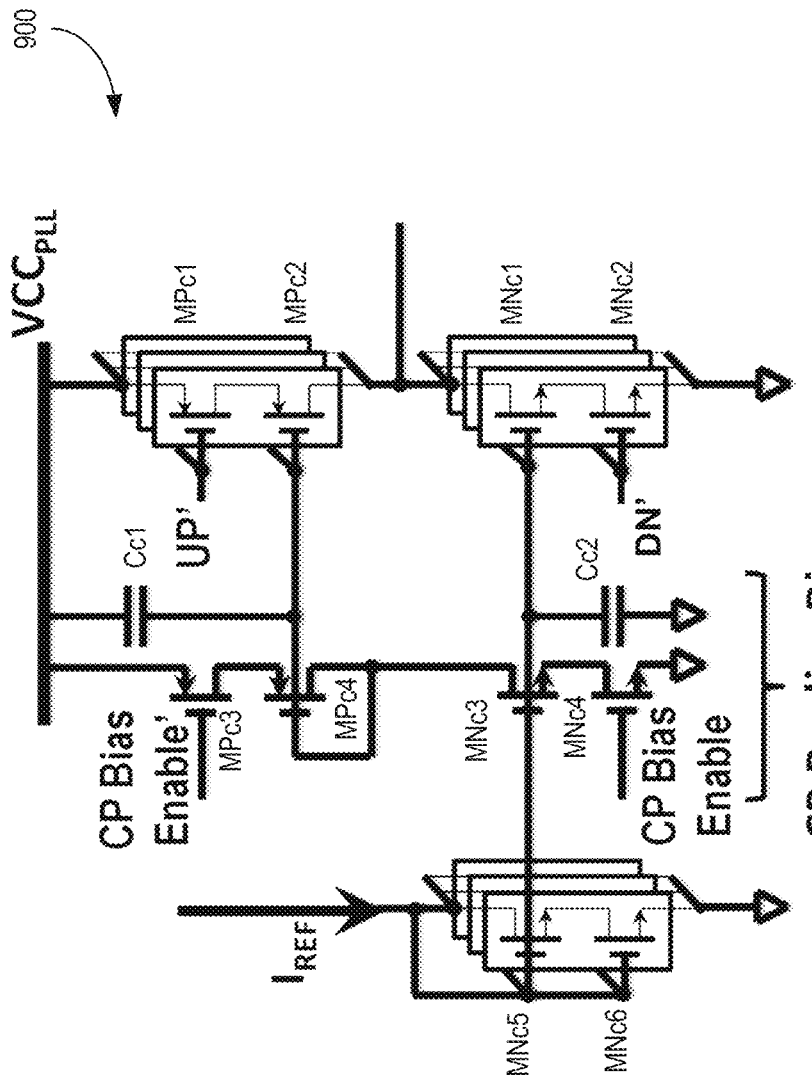
FIG. 9 illustrates a charge pump circuitry that uses the $I_{REF}$ generated by the reference generator of FIG. 3, according to some embodiments of the disclosure.

FIG. 9 illustrates charge pump circuitry 900 that uses the $I_{REF}$ generated by the reference generator of FIG. 3, according to some embodiments of the disclosure. It is pointed out that those elements of FIG. 9 having the same reference numbers (or names) as the elements of any other figure can operate or function in any manner similar to that described, but are not limited to such. Charge pump circuitry 900 comprises p-type transistors MPc1, MPc2, MPc3, and MPc4; n-type transistors MNc1, MNc2, MNc3, MNc4, MNc5, and MNc6, and capacitive devices Cc1 and Cc2 coupled together as shown. Here, transistor(s) MPc1 are controlled by UP' (e.g., inverse of UP) while transistor(s) MNc2 are controlled by DN' (e.g., inverse of DN), transistors $MP_{c3}$ and $MN_{c3}$ are enabled by charge pump bias enable' (CP Bias Enable').

In some embodiments, the CP replica bias in the charge pump and the reset-to-$VCC_{PLL}/2$ circuit in the loop filter of FIG. 8 are power gated, reducing the total PLL power by, for example, at least 10% at 100 MHz reference. Here, the term "power gated" generally refers to stopping the flow of power to a device in response to a signal such as a signal indicating lack of power or very low power. In some embodiments, the PFD circuit in block 204 generates a CP Bias Enable pulse when either the reference or feedback clock goes high and delays both clocks by, for example, approximately 200 picoseconds (ps), to awaken and settle the CP Replica Bias before the arrival of the UP/DN signals. In some embodiments, the CP Bias Enable pulse is turned low at the falling edge of the UP/DN signals. In some embodiments, after the PLL locks, the UP/DN pulse width is near its minimum width (e.g., 100 ps), and the CP bias power saving is high (e.g., greater than 95%). This approach, for example, allows higher CP bias current to protect against transistor variation, an advantage compared to low-µA bias with a large current mirror ratio in the charge pump.

For loop filter 800/206, the DC current through the resistor divider is reduced, for example by approximately 50%, since the current is enabled merely during the reset phase. In VCO 207, transistors are stacked to improve phase noise and the p-type current source output resistance. The latter helps to reject supply noise, for example by greater than 15 dB from $VCC_{PLL}$ to the oscillator virtual supply $V_{RO}$, given adequate VCO current tuning and the AC coupling from $VCC_{PLL}$ through $C_1$ to $V_{CTL}$. The coupling keeps Vgs of the p-type current source from $VCC_{PLL}$ noise. In one example, the measured PLL long-term Dj using an injected 2-to-20 MHz sinusoidal tone with gauged amplitude on local $VCC_{PLL}$ supports the amount of supply noise rejection.

Figure 10:
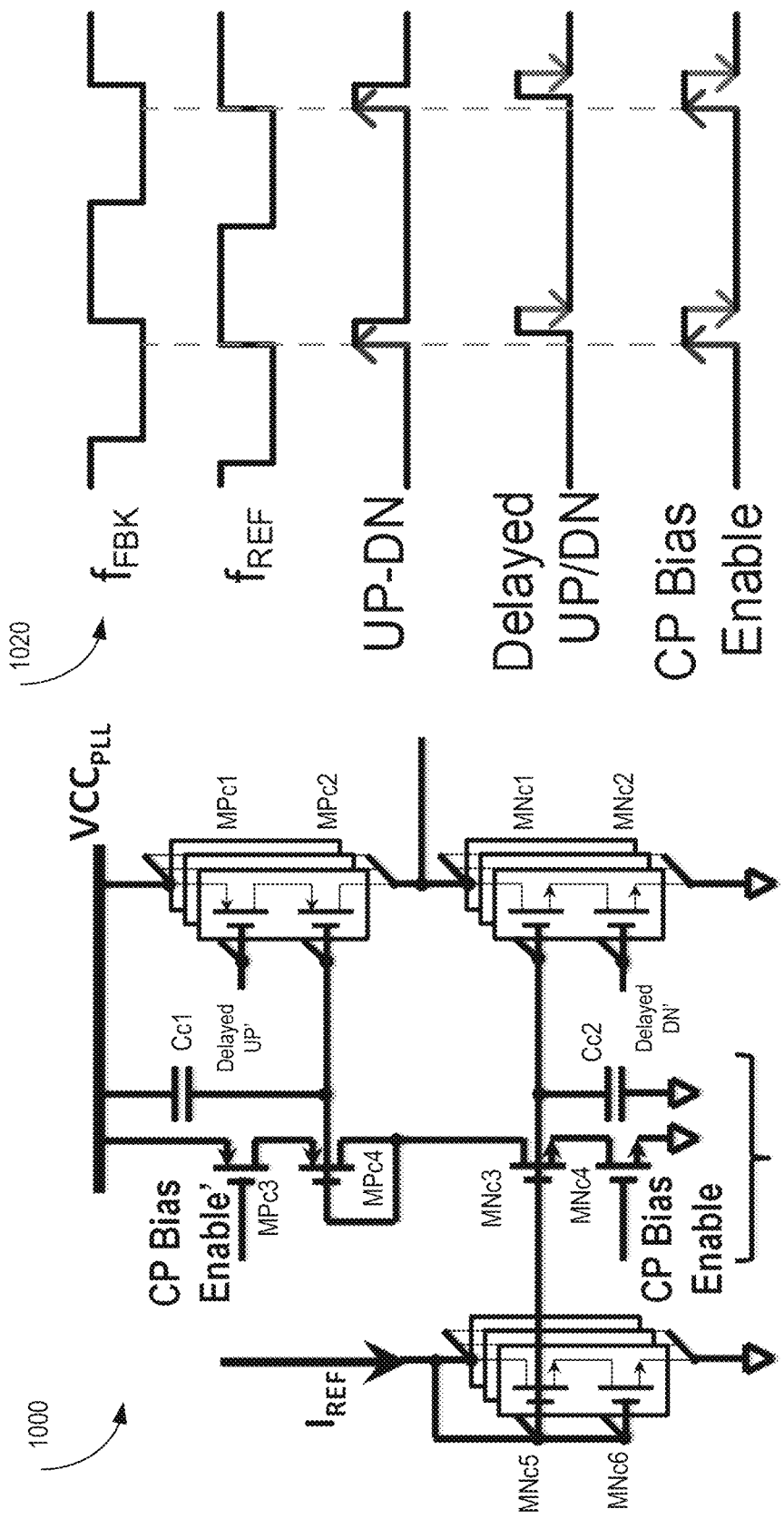
FIGS. 10A-B illustrate a charge pump circuitry that uses the $I_{REF}$ generated by the reference generator of FIG. 3 and corresponding timing diagram, respectively, according to some embodiments of the disclosure.

FIGS. 10A-B illustrate charge pump circuitry 1000 that uses the $I_{REF}$ generated by the reference generator of FIG. 3 and corresponding timing diagram 1020, respectively, according to some embodiments of the disclosure. It is pointed out that those elements of FIGS. 10A-B having the same reference numbers (or names) as the elements of any other figure can operate or function in any manner similar to that described, but are not limited to such. Charge pump circuitry 1000 is similar to charge pump circuitry 900 except that the UP' and DN' signals receives by transistors MPc1 and MNc2 are delayed. The delayed UP' and DN' signals are generated by a delay line, in accordance with some embodiments. In one example, the delay for UP'/DN' signals to transistors MPc1 and MNc2 is approximately 200 ps, to allow the bias voltage settle.

Figure 11:
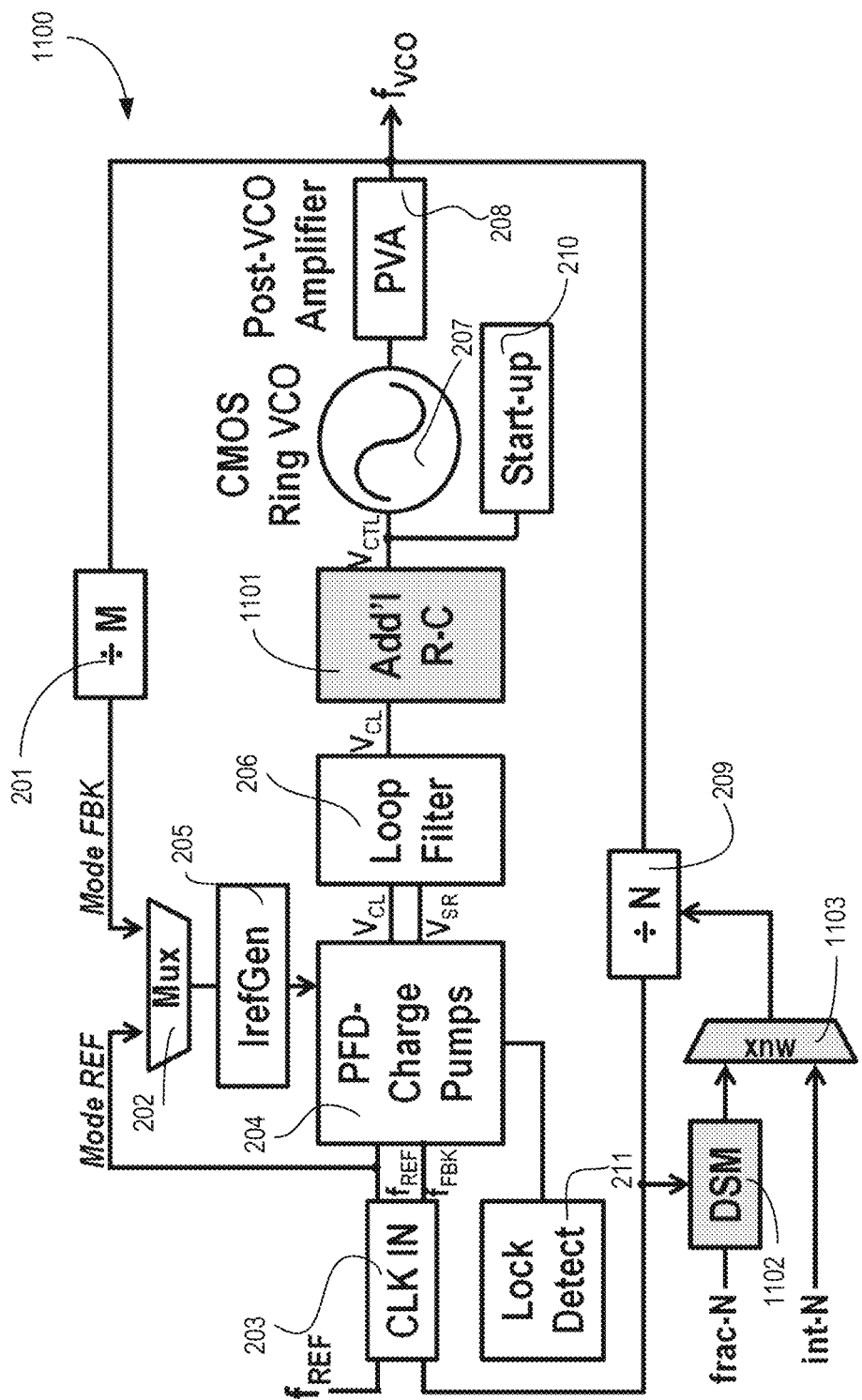
FIG. 11 illustrates a high-level architecture of a CP-PLL that selectively uses one of a reference clock or oscillator output clock to generate $I_{REF}$, and with additional resistor-capacitor (RC) network and delta sigma modulator (DSM) for fractional-N and spread spectrum clocking, according to some embodiments of the disclosure.

FIG. 11 illustrates a high-level architecture 1100 of a CP-PLL that selectively uses one of a reference clock or oscillator output clock based reference current generator, and with additional resistor-capacitor (RC) network, according to some embodiments of the disclosure. Architecture 1100 is similar to architecture 200 except that additional RC filter 1101, delta-sigma modulator (DSM) 1102, and multiplexer (MUX) 1103. In some embodiments, RC filter 1101 is added between loop filter 206 and oscillator 207 to suppress high-pass quantization noise due to DSM 1102. In some embodiments, DSM 1102 receives a fractional 'N' value (frac-N) and provides it to MUX 1103. In some embodiments, MUX 1103 can selectively provide 'N' as an integer (int-N) or a fractionally modulated 'N' from DSM 1102 to first divider 209.

As such, the PLL of architecture 1100 provides spread-spectrum clocking (SSC) and fractional-N capability. In this example, the PLLs' RMS integrated jitter increases, for instance by approximately 6%, when the supply is regulated by a low dropout (LDO) regulator compared to LDO-bypassed supply (e.g., with a 2 MHz low-pass RC filter). The latter completely eliminates the LDO power consumption, in accordance with some embodiments.

Figure 12:
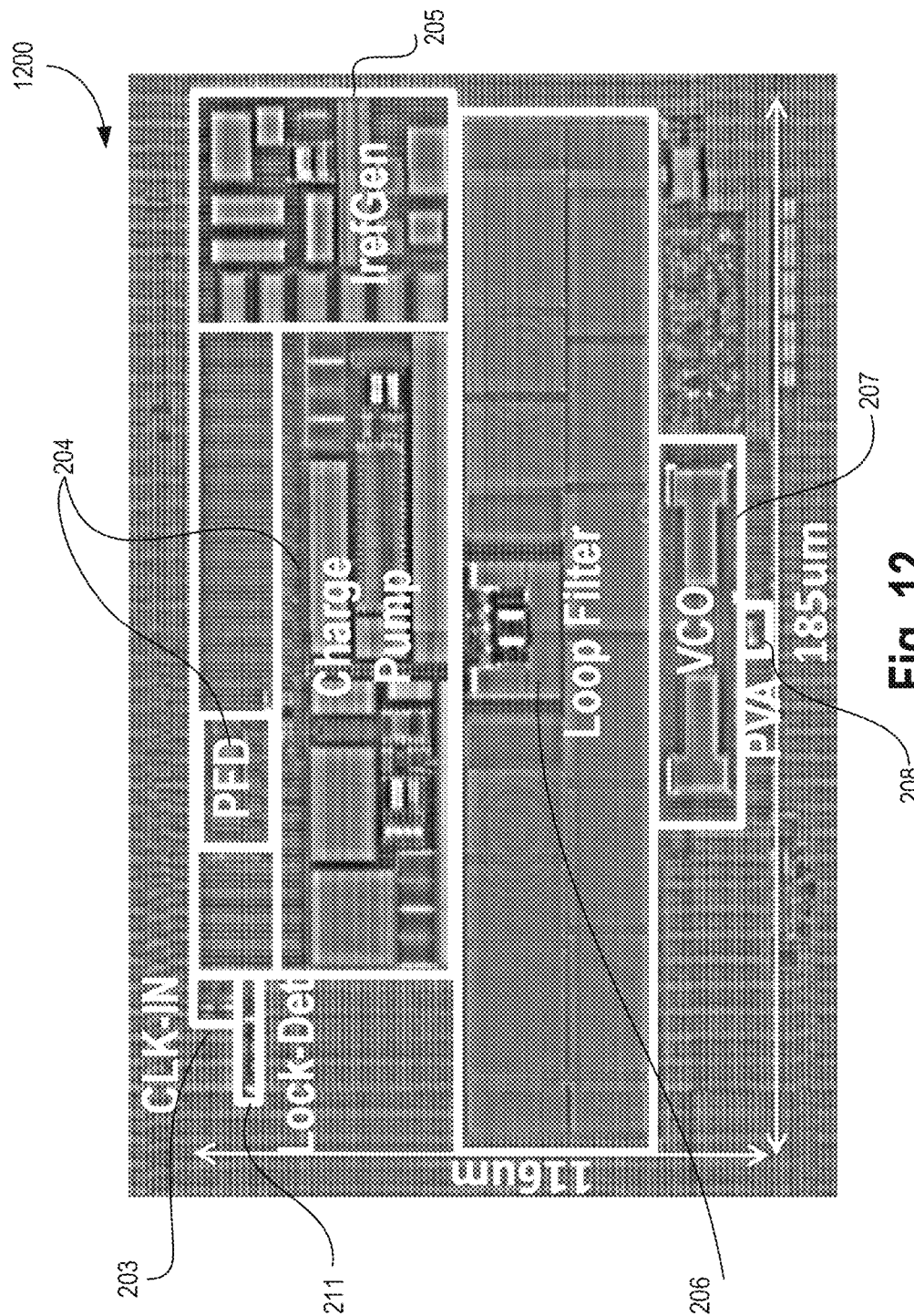
FIG. 12 illustrates a floorplan of a layout of the CP-PLL of FIG. 2, according to some embodiments of the disclosure.

FIG. 12 illustrates floorplan 1200 of a layout of the CP-PLL of FIG. 2, according to some embodiments of the disclosure. In this example, the area of the IrefGen circuit 205 takes 0.00315 mm² in 14 nm CMOS process technology, or 15% of the PLL area. The circuit consumes 13% of the total PLL power (e.g., 2.6 mW at $f_{OUT}$=4 GHz).

Figure 13:
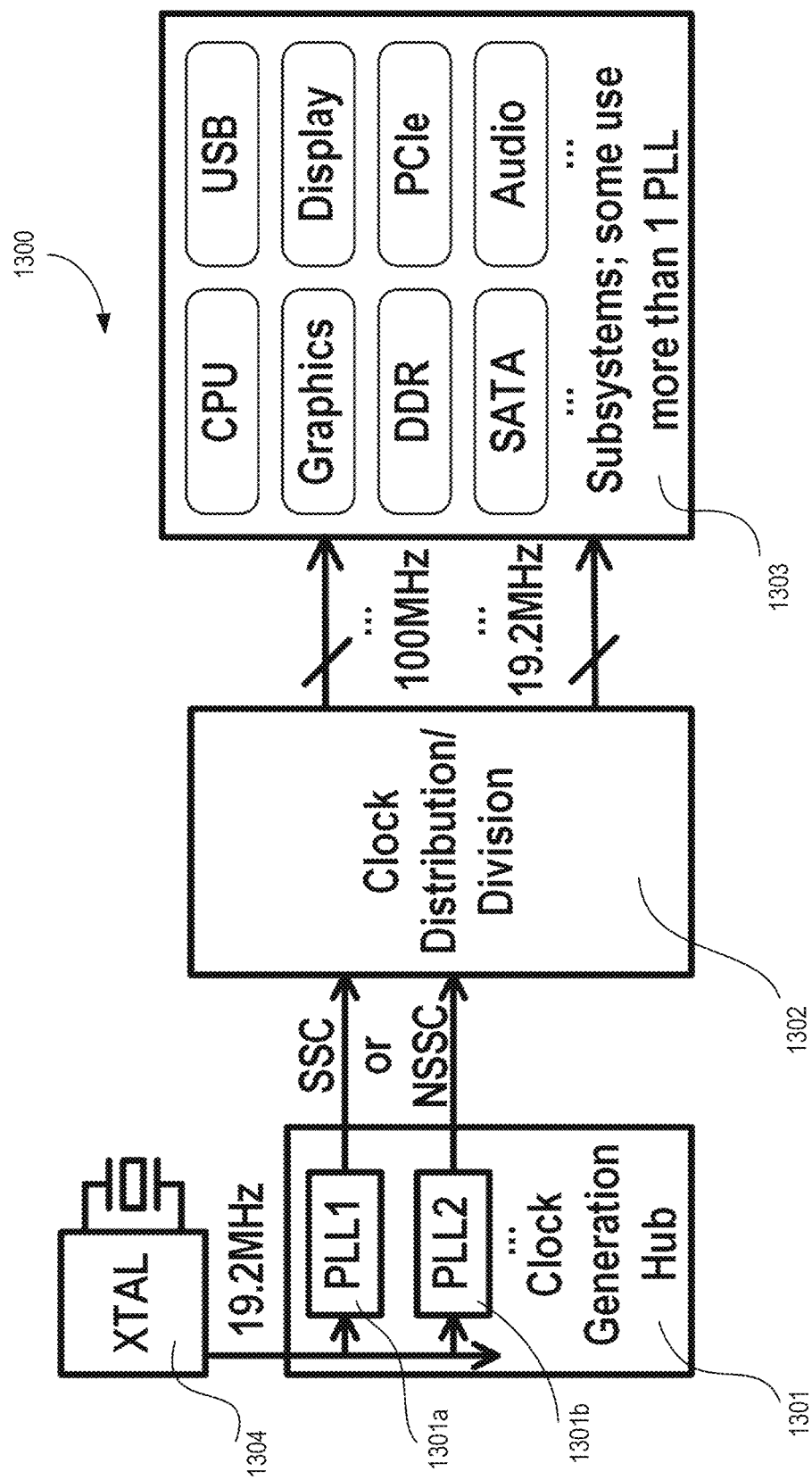
FIG. 13 illustrates a clocking system that uses one or more PLLs that have the reference generator of FIG. 3, according to some embodiments of the disclosure.

FIG. 13 illustrates clocking system 1300 that uses the reference generator of FIG. 3, according to some embodiments of the disclosure. In some embodiments, clocking system 1300 comprises Clock Generation Hub 1301, Clock Distribution Division 1302, Subsystem block 1303 that use clocks of different frequencies, and a crystal oscillator (XTAL) 1304. In some embodiments, Clock Generation Hub 1301 comprises a clock source having a plurality of PLLs (e.g., 1301a and 1301b) such as those discussed with reference to FIG. 2 and FIG. 11, or a variety of different PLLs including the PLLs of FIG. 2 or FIG. 11. The PLLs may generate spread spectrum clock (SSC) or non-spread spectrum clock (NSSC) to be distributed by Clock Distribution Division 1302. In this example, the clocks from the Clock Distribution Division 1302 may satisfy clocking requirements for a variety of subsystems. For example, clock frequencies ranging from 19.2 MHz to 100 MHz and more may be provided to a variety of subsystems such as: central processing unit (CPU), Universal Serial Bus (USB) interface, Graphics unit, Display, Double Data Rate (DDR) interface, Peripheral Component Interconnect Express (PCIe) interface, SATA interface, Audio, etc. In some embodiments, blocks 1301, 1302, 1303, and 1304 may be separate components on different dies and packages. In some embodiments, some or all of blocks 1301, 1302, 1303, and 1304 may be integrated on a single package with multiple dies or single die in a single package or other combinations.

Figure 14:
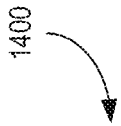
FIG. 14 illustrates a table showing comparative improvement of various PLL performance parameters using the reference generator of FIG. 3, according to some embodiments of the disclosure.

FIG. 14 illustrates table 1400 showing comparative improvement of various PLL performance parameters using the reference generator of FIG. 3, according to some embodiments of the disclosure. Table 1400 summarizes the measured performance and compares it with other state-of-the-art low power ring oscillator (RO) based PLLs.

Figure 15:
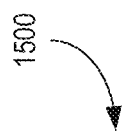
FIG. 15 illustrates a table showing measurements of various clocking parameters generated by a clocking source that uses the reference generator of FIG. 3, and comparing those measurements with a Peripheral Component Interconnect Express (PCIe) Generation 2 specification, according to some embodiments of the disclosure.

FIG. 15 illustrates table 1500 showing measurements of various clocking parameters generated by clocking source that uses the reference generator of FIG. 3, and comparing those measurements with specification of a Peripheral Component Interconnect Express (PCIe) Generation 2 specification, according to some embodiments of the disclosure. While low jitter Inductor-Capacitor (LC) PLLs with higher power consumption are commonly used to support PCIe Gen2 and Gen3 clocking, shown in Table 1500, PLL of various embodiments can be re-configured to meet the PCIe jitter requirements with less than 3.5 mW ($f_{VCO}$=5 GHz) at $VCC_{PLL}$=0.95 V.

Figure 16:
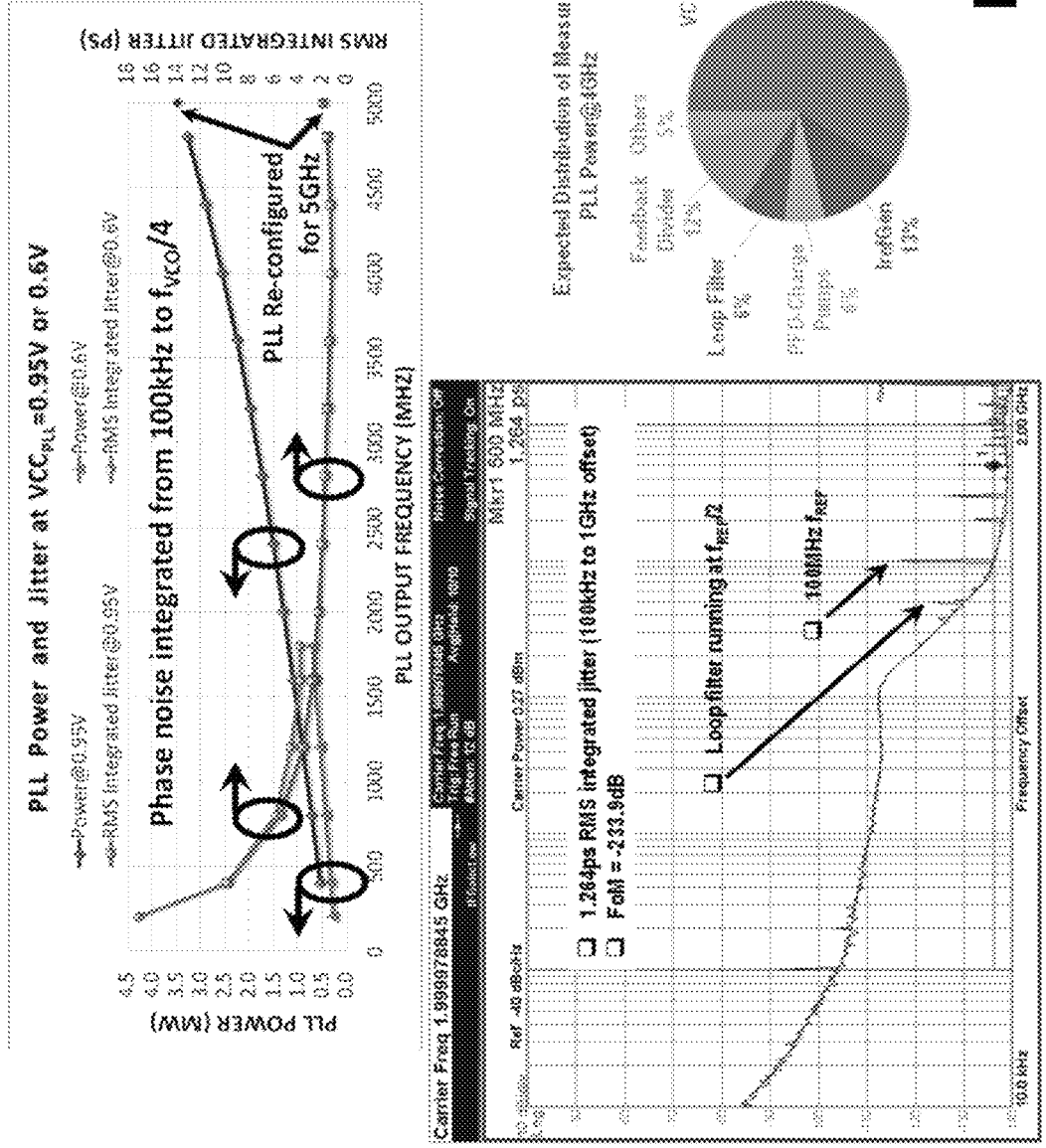
FIG. 16 illustrates the PLLs' power dissipation and Root-Mean-Square (RMS) integrated jitter at various supply voltages, according to some embodiments of the disclosure.

FIG. 16 illustrates the PLLs' power dissipation and Root-Mean-Square (RMS) integrated jitter at various supply voltages, according to some embodiments of the disclosure. In this example, with $f_{REF}$=100 MHz, the PLL supports 400 MHz to 5 GHz at $VCC_{PLL}$=0.95 V, and 200 MHz to 1.8 GHz at $VCC_{PLL}$=0.6 V. The jitter performance across the frequency span is achieved through the self-tuning IrefGen (mode FBK) by only changing the divide ratio 'N'; no other PLL core settings are changed per $VCC_{PLL}$, except for $f_{VCO}$=5 GHz. The measured PLL bandwidth is maintained within 14±3 MHz between 1 GHz and 4 GHz $f_{VCO}$ for 0.95 V $VCC_{PLL}$, and similarly for 0.6V $VCC_{PLL}$. At 4 GHz output and 0.95 V supply, the PLL's RMS integrated jitter is 1.26 ps at 2.6 mW, leading to a FoM of −233.9 dB.

Figure 17:
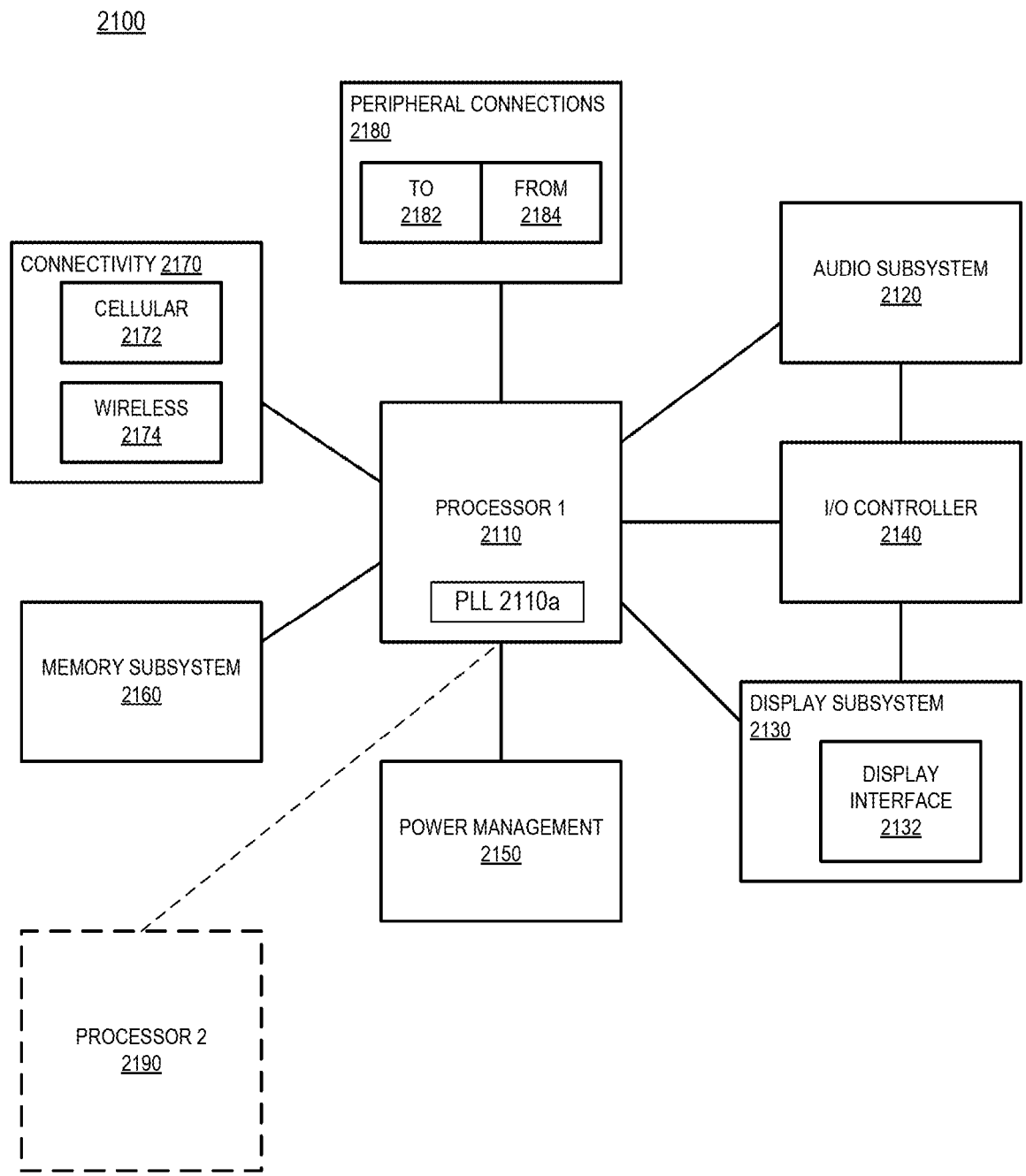
FIG. 17 illustrates a smart device or a computer system or a SoC (System-on-Chip) using the reference generator of FIG. 3, according to some embodiments.

FIG. 17 illustrates a smart device or a computer system or a SoC (System-on-Chip) using the reference generator of FIG. 3, according to some embodiments. It is pointed out that those elements of FIG. 17 having the same reference numbers (or names) as the elements of any other figure can operate or function in any manner similar to that described, but are not limited to such.

FIG. 17 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 using the reference generator of FIG. 3, according to some embodiments discussed. Other blocks of the computing device 2100 may also include the reference generator of FIG. 3, according to some embodiments. In some embodiments, first processor 2110 includes a PLL 2110a that uses the reference generator of various examples discussed herein. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus which comprises: an oscillator to generate a first clock having a first frequency; a divider coupled to the oscillator, wherein the divider is to generate a second clock having a second frequency; and a current reference generator comprising a switched capacitor circuitry which is to receive the second clock directly or indirectly.

Example 2 includes features of example 1, and wherein the current reference generator comprises: a sequential logic to receive the second clock directly or indirectly, and to generate sampled control signals for at least two transistors.

Example 3 includes features of example 1, and wherein the current reference generator comprises an amplifier having a first input to receive a reference voltage and a second input coupled to the switched capacitor circuitry.

Example 4 includes features of example 3, and wherein the current reference generator comprises a transistor which is to be controlled by an output of the amplifier.

Example 5 includes features of example 1, and wherein the divider is one of an integer divider or fractional divider.

Example 6 includes features of example 1, wherein the apparatus of example 6 comprises: a charge pump to receive a reference current from the reference generator.

Example 7 includes features of example 1, wherein the apparatus of example 7 comprises a loop filter coupled to the charge pump and the oscillator.

Example 8 includes features of example 1, wherein the apparatus of example 8 comprises an amplifier coupled to an output of the oscillator and an input of the divider.

Example 9 includes features of example 1, and wherein the divider is an adaptive divider such that the second frequency can be adjusted in response to a control.

Example 10 includes features of example 1, and wherein the oscillator is one of: a voltage control oscillator (VCO), an Inductor-Capacitor (LC) based VCO, or a digitally controlled oscillator (DCO).

Example 11 is an apparatus which comprises: a phase detector to receive a reference clock and a feedback clock; a charge pump coupled to the phase detector; a reference current generator coupled to the charge pump; a loop filter coupled to the charge pump; an oscillator coupled to the loop filter; an amplifier coupled to the oscillator; a first divider coupled to an output of the amplifier and to provide the feedback clock; and a second divider coupled to the output of the amplifier and the reference current generator.

Example 12 includes features of example 11, wherein the apparatus of example 12 comprises a lock detector to indicate via a lock indicator when a phase of the feedback clock is aligned with a phase of the reference clock.

Example 13 includes features of example 12, wherein the second divider is to receive the lock indicator and to adjust a frequency of its output according to a logic condition of the lock indicator.

Example 14 includes features of example 11, wherein the apparatus of example 14 comprises a multiplexer coupled to the second divider and the reference generator, wherein the multiplexer is to selectively provide one of an output of the second divider or the reference clock to the reference generator.

Example 15 is a system which comprises: a memory; a processor coupled to the memory, the processor having a phase locked loop (PLL) circuitry which includes an apparatus according to any one examples 1 to 14; and a wireless interface to allow the processor to communicate with another device.

Example 16 includes all features of example 15, and wherein the PLL is a charge-pump based PLL.

Example 17 includes all features of example 15, and wherein the PLL comprises a charge pump which is to receive a reference current from the current reference generator.

Example 18 includes all features of example 15, wherein the system of example 18 comprises a display which is communicatively coupled to the processor.

Example 19 is a method which comprises: generating a first clock having a first frequency; dividing the first frequency of the first clock to generate a second clock having a second frequency; providing the second clock to a current reference generator comprising a switched capacitor circuitry; and generating a reference current according to the second clock.

Example 20 includes all features of example 19, and wherein generating the reference current according to the second clock comprises: generating sampled control signals for at least two transistors using the second clock.

Example 21 is an apparatus which comprises: means for generating a first clock having a first frequency; means for dividing the first frequency of the first clock to generate a second clock having a second frequency; means for providing the second clock to a current reference generator comprising a switched capacitor circuitry; and means for generating a reference current according to the second clock.

Example 22 includes all features of example 21, and wherein the means for dividing is one of an integer divider or fractional divider.

Example 23 includes all features of example 22, and wherein the apparatus of example 23 comprises pumping means to receive a reference current from the means for generating the reference current.

Example 24 includes all features of example 22, and wherein the apparatus of example 23 comprises filtering means coupled to the pumping means and the means for generating the first clock.

Example 25 includes all features of example 22, wherein the apparatus of example 24 comprises means for amplifying coupled to an output of the means for generating the first clock and an input of the means for dividing.

Example 26 includes all features of example 23, and wherein the means for dividing is adaptive such that the second frequency can be adjusted in response to a control.

Example 27 includes all features of example 23, and wherein the means for generating the first clock is one of: a voltage control oscillator (VCO), an Inductor-Capacitor (LC) based VCO, or a digitally controlled oscillator (DCO).

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   an oscillator to generate a first clock having a first frequency;
   an amplifier coupled to an output of the oscillator, wherein the amplifier is to amplify the first clock to generate an amplified first clock;
   a first divider coupled to the output of the amplifier, wherein the first divider is to divide the amplified first clock and is to generate a second clock having a second frequency;
   a second divider coupled to the output of the amplifier, wherein the second divider is to divide the amplified first clock to generate a third clock having a third frequency;
   a selection circuitry to select one of the second clock or a reference clock as an output clock;
   a current reference generator comprising a switched capacitor circuitry, wherein the switched capacitor circuitry is to apply the output clock via the selection circuitry, and wherein the current reference generator is to generate a reference current in accordance with an output of the switched capacitor circuitry.

2. The apparatus of claim 1, wherein the current reference generator comprises:
   a sequential logic to receive the second clock, and to generate sampled control signals for at least two transistors of the switched capacitor circuitry.

3. The apparatus of claim 1, wherein the current reference generator comprises an amplifier having a first input to receive a reference voltage and a second input coupled to the switched capacitor circuitry.

4. The apparatus of claim 3, wherein the current reference generator comprises a transistor, which is to be controlled by an output of the amplifier.

5. The apparatus of claim 1, wherein the divider is one of an integer divider or fractional divider.

6. The apparatus of claim 1 comprises a charge pump to receive the reference current from the current reference generator.

7. The apparatus of claim 6 comprises a loop filter coupled to the charge pump and the oscillator.

8. The apparatus of claim 1, wherein the first divider is an adaptive divider such that the second frequency can be adjusted in response to a control.

9. The apparatus of claim 1, wherein the oscillator is one of: a voltage control oscillator (VCO), an Inductor-Capacitor (LC) based VCO, or a digitally controlled oscillator (DCO).

10. A system comprising:
    a memory;
    a processor coupled to the memory, the processor having a phase locked loop (PLL) circuitry which includes:
       an oscillator to generate a first clock having a first frequency;
       an amplifier coupled to an output of the oscillator, wherein the amplifier is to amplify the first clock to generate an amplified first clock;
       a first divider coupled to the output of the amplifier, wherein the first divider is to divide the amplified first clock and is to generate a second clock having a second frequency;
       a second divider coupled to the output of the amplifier, wherein the second divider is to divide the amplified first clock to generate a third clock having a third frequency;
       a selection circuitry to select one of the second clock or a reference clock as an output clock; and
       a current reference generator comprising a switched capacitor circuitry, wherein the switched capacitor circuitry is to apply the output clock via the selection circuitry, and wherein the current reference generator is to generate a reference current in accordance with an output of the switched capacitor circuitry; and
    a wireless interface to allow the processor to communicate with another device.

11. The system of claim 10, wherein the PLL is a charge-pump based PLL.

12. The system of claim 10, wherein the PLL comprises a charge pump which is to receive the reference current from the current reference generator.

13. The system of claim 10 comprises a display which is communicatively coupled to the processor.

14. The system of claim 10, wherein the first divider is an adaptive divider such that the second frequency can be adjusted in response to a control.

15. The system of claim 10, wherein the oscillator is one of: a voltage control oscillator (VCO), an Inductor-Capacitor (LC) based VCO, or a digitally controlled oscillator (DCO).

16. An apparatus comprising:
an oscillator to generate a first clock having a first frequency;
an amplifier coupled to an output of the oscillator, wherein the amplifier is to amplify the first clock and is to generate a second clock with the first frequency;
a first divider coupled to an output of the amplifier, wherein the first divider is to divide the second clock and to generate a third clock of a second frequency, wherein the third clock is eventually received as input by a phase detector;
a second divider coupled to the output of the amplifier and a multiplexer, wherein the second divider is to divide the second clock and is to generate a fourth clock with a third frequency; and
a current reference generator comprising a switched capacitor circuitry, wherein the switched capacitor circuitry is to apply the fourth clock via the multiplexer, and wherein the current reference generator is to generate a reference current in accordance with an output of the switched capacitor circuitry.

17. The apparatus of claim 16, wherein the multiplexer is to receive a reference clock, which is also received by the phase detector.

18. The apparatus of claim 16, wherein an output of the multiplexer is a clock, which is one of the reference clock or the fourth clock, wherein the output of the multiplexer is coupled to a clock input of a sequential logic, and wherein an output of the sequential logic is coupled to the switched capacitor circuitry.

19. The apparatus of claim 16, wherein the switched capacitor circuitry is coupled to an input of an amplifier.

* * * * *